United States Patent
Shokrollahi

(10) Patent No.: US 8,296,632 B1
(45) Date of Patent: Oct. 23, 2012

(54) ENCODING AND DECODING OF GENERALIZED REED-SOLOMON CODES USING PARALLEL PROCESSING TECHNIQUES

(76) Inventor: Mohammad Amin Shokrollahi, Preverenges (CH)

(*) Notice: Subject to any disclaimer, the term of this patent is extended or adjusted under 35 U.S.C. 154(b) by 644 days.

(21) Appl. No.: 12/479,605

(22) Filed: Jun. 5, 2009

Related U.S. Application Data

(60) Provisional application No. 61/059,456, filed on Jun. 6, 2008.

(51) Int. Cl.
*G06F 11/00* (2006.01)
(52) U.S. Cl. .......................... 714/781; 714/784; 714/798
(58) Field of Classification Search .................. 714/781, 714/784, 798
See application file for complete search history.

(56) References Cited

U.S. PATENT DOCUMENTS 4,845,713 A * 7/1989 Zook .............................. 714/784
4,873,688 A * 10/1989 Maki et al. ..................... 714/784

* cited by examiner

*Primary Examiner* — Fritz Alphonse
(74) *Attorney, Agent, or Firm* — Kilpatrick Townsend & Stockton LLP

(57) ABSTRACT

A system, computer program, and/or method for encoding data that can correct r/2 errors. The original symbols are transformed using a Fourier transform of length p. Generator polynomials are used to encode the p blocks separately, and an inverse Fourier transform is applied to obtain the redundant symbol. In a decoding system, Fourier transforms are applied to every set of p consecutive symbols of the received vector, to obtain p blocks of symbols which in total have the same size as the received vector. Next, a syndrome calculator is applied to each of these blocks to produce p syndromes. The syndromes are forwarded to a Berlekamp-Massey unit and an error locator polynomial is decimated into p parts and a Chien search is applied concurrently. A Fourier transform of length p is applied to values calculated by the Chien search, and the positions of the zeros obtained are error positions.

22 Claims, 9 Drawing Sheets

$A = u(\alpha^{-j})$
$B = u(\alpha^{-j}\rho^{-2})$
$C = u(\alpha^{-j}\rho^{-1})$

ENCODING AND DECODING OF GENERALIZED REED-SOLOMON CODES USING PARALLEL PROCESSING TECHNIQUES

CROSS-REFERENCE TO RELATED APPLICATIONS

The present application claims the benefit under 35 U.S.C. 119(e) of the U.S. Provisional Patent Application No. 61/059,456 filed on Jun. 6, 2008, which is herein incorporated by reference in its entirety for all purposes.

FIELD OF THE INVENTION

The present invention relates in general to encoding and decoding using Reed-Solomon codes and in particular to more efficient methods of encoding and decoding where limited computational resources are available.

BACKGROUND OF THE INVENTION

Resilient transmission of digital information is an important problem and much development has been done in this area. A general description of the problem is how to move data from a source to a destination, separated by a channel across a distance and/or a time, resiliently, i.e., in a manner that allows for recovery of errors that the channel may introduce in the data as it moves.

Forward error correction ("FEC") provides a mechanism for error detection/correction. An FEC encoder encodes the data to be sent into a form that contains, in addition to the original information of the data, redundant data that may help in recovering the original data if it is corrupted by the channel. In a typical case, but not always, the data to be transmitted is representable as a set of bit values, or vectors of bit values, called symbols. With FEC, redundant symbols are calculated from the input symbols and the input symbols and redundant symbols are what are sent through the channel. In a variation, the original input symbols are not explicitly present but can be recovered from what is sent. That variation is referred to as "nonsystematic" encoding.

There are a variety of communications channels to which the method of forward error correction can be used. A communications channel could be one in which transmission is carried over space, between two spatially separated users, such as, for example, transmission of voice across a wireless telephone network or transmission of TV signals between a transmitter and a sender via a satellite. Corruption of data can occur for a variety of physical reasons, such as atmospheric discharges, rain attenuation, or simply obstacles in the transmission path used by the channel.

A communications channel could also facilitate transmission over time. Such is the case for storage media for example, where data is stored at one time and read from the same device at a different time. In this case, corruption can occur, for example, when scratches on the surface of the physical storage device lead to errors of the read head. In general, where the device uses magnetization of the surface to store information, the strength of such magnetization may fade for a variety of reasons, leading to an inaccurate measurement of the stored data, and ultimately to read errors. If unprotected, such errors cause a catastrophic loss of information, rendering storage of digital information largely ineffective.

However the errors occur, FEC can be used to recover from those errors. One particular type of FEC often employed in communication using Reed-Solomon coding. Reed-Solomon coding is well known. See, for example, Lin, S., and Costello, D., "Error Control Coding Fundamentals and Applications" or MacWilliams, F. J., and Sloane, N., "The Theory of Error-Correcting Codes". Reed-Solomon codes have a desirable advantage in that they can guarantee recovery from some maximum number of errors determined by the number of original symbols forming a block and the number of redundant symbols for that block. A data transmission error is any event that changes the value or apparent value of a symbol to something other than its original value.

Specifically, where a Reed-Solomon encoder encodes k input symbols with r redundant symbols and the sender transmits those n=k+r encoded symbols, a Reed-Solomon decoder is capable of correcting any pattern of r/2 errors in the received n symbols, regardless of their magnitude or their position. However, while larger values of k and r allow for greater numbers of errors, the computational effort rises nonlinearly and thus poses limits of their size.

The symbol-based mode of operation of Reed-Solomon codes makes it an ideal choice in situations where the underlying bits of information are corrupted in bursts, rather than randomly, leading to a smaller number of symbol errors. Encoding and decoding of data using Reed-Solomon codes over an alphabet of size q requires various arithmetic operations with polynomials over the field GF(q) with q elements. Typically, the code is specified by a set of "roots" which are n=k+r consecutive powers of a primitive element $\alpha$ of the underlying field. Often in practice these roots are just the first n powers of $\alpha$, starting from the power $1=\alpha^0$, but this need not always be the case.

An encoding operation might start with calculating a polynomial g(x) of degree r, called the generator polynomial of the code. This polynomial is obtained as the polynomial of smallest degree having the first r consecutive powers of a (starting with $1=\alpha^0$) as its roots. Next, the vector inp(0), . . . , inp(k−1) of input symbols is represented as the polynomial $x^{r}*(inp(0)+inp(1)*x+ \ldots +inp(k-1)*x^{k-1})$, and this polynomial is in turn divided by the generator polynomial g(x). The coefficients of the remainder of this division, which is a polynomial of degree less than r, are interpreted as the r redundant symbols corresponding to the input symbols.

The division by g(x) is typically accomplished in hardware using a device called a linear feedback shift register, which can be faster than doing this in software. Such a device has the advantage of being simple to implement in hardware, and not requiring the entire input sequence be present at the onset of the decoding. In contrast, at every computation cycle, one more input symbol needs to be injected into the decoder, leading to a pipelined encoding architecture.

In a typical approach, the decoding of Reed-Solomon codes is accomplished in several steps upon reception of a (possibly corrupted) word y(0), . . . , y(n−1): (i) calculation of the syndromes, (ii) calculation of the error-locator and error-value polynomials, (iii) performing a Chien search to recover the roots of the error-locator, and with that the error positions, and (iv) calculating the error values. Such operations can be done in hardware, software or a combination that might involve dedicated hardware and/or software elements.

In a first step, r syndromes s(0), . . . , s(r−1) are calculated from the received symbols y(0), . . . , y(n−1). Next, the syndromes are forwarded to a unit/module/etc. that calculates two polynomials, v(x) and u(x), where u(x) is of degree t, t being the actual number of errors in the received word, and v(x) is of degree smaller than t. These two polynomials are often computed by hardware and/or software using the Berlekamp-Massey algorithm. The roots of the polynomial u(x) among the first n powers of a determine the positions of the errors. These roots can be calculated with a procedure that is very efficient for hardware implementation called the "Chien search" procedure. In a Chien search, all consecutive powers of α are tried, one-by-one, and whenever a root of the polynomial u(x) is found, a corresponding error position is noted and saved. Finally, using Forney's formulas or other method, the error values are calculated from u(x) and the error value polynomial v(x).

The need for ever more powerful applications requires the transmission of larger and larger pieces of data. With this comes the need for protection of larger pieces of data. Current methods for encoding and decoding of data using Reed-Solomon codes will require more resources on the digital processors or electronic circuits that are used to perform these methods. Often, these processors are meant for tasks that are more relevant to the application than encoding and decoding. For example, when a movie is to be shown on a wireless device, most of the processing time is spent on the processing the movie (e.g., decompression and rendering for the display) than on communication of the bits representing the movie.

The situation is even more pronounced for storage devices where block sizes are increasing and encoding results in better protection of the data, and ultimately a better commercial advantage against other storage technologies. More concretely, in a typical storage application, data is read units of "sectors". The size of a sector is measured in bytes, and is typically in the range of 512 through 1024 bytes, though it is expected that new sector sizes grow to 4096 bytes as storage devices increase in overall capacity. In the upper range of this interval, that is, when the sector size is 4096, it could be advisable to work with a Reed-Solomon code over the field GF(4096), in which the value of k is 2731, corresponding to roughly 4096 bytes. In this case, the Chien search comprises looking through 2731 powers of the element α. This rather large number could lead to computational bottlenecks.

What is desired is a different method of encoding data that has the desirable error-correction advantages of Reed-Solomon codes, but also allows for faster decoding without requiring significant increases in hardware costs.

BRIEF SUMMARY OF THE INVENTION

In embodiments of an encoder, a data transmitter, a decoder, a data receiver, and/or a communications system incorporating one or more of these, hardware, software, and/or firmware are provided to handle Reed-Solomon encoding and/or decoding in a more efficient manner than conventional Reed-Solomon encoding and decoding.

In an example method, a code is constructed for which the set of roots is closed under multiplication with a p-th root of unity in the field GF(q) underlying the code, wherein p is a divisor of q−1. Next, p generator polynomials are calculated. The original symbols are transformed using a Fourier transform of length p, into p sequences such that the total number of symbols within these sequences is the same as the total number of original symbols. Next, the generator polynomials are used to encode the p blocks separately, and an inverse Fourier transform is applied to obtain the redundant symbol. In other variations, Fourier transforms are not used.

In an example decoding system according to aspects of the present invention, a set of Fourier transforms is applied to every set of p consecutive symbols of the received vector, to obtain p blocks of symbols, which in total have the same size as the received vector. Next, a syndrome calculator is applied to each of these blocks concurrently to produce p syndromes per iteration. An error locator and an error value polynomial are then calculated from the syndromes, possibly using a Berlekamp-Massey process. The error locator polynomial is then decimated into p parts of equal part, and on each part a Chien search can be applied concurrently. A Fourier transform of length p can be applied to the values calculated by the Chien search, and the positions of the zeros obtained this way are interpreted as error positions.

The following detailed description together with the accompanying drawings will provide a better understanding of the nature and advantages of the present invention.

BRIEF DESCRIPTION OF THE DRAWINGS

FIG. 3 illustrates inputs and outputs of a circuit or software for performing a Fourier transform of length p=3 and its inverse, and can be extended for other values of p.

FIG. 4 illustrates an example of an encoder according to embodiments of the present invention, usable for encoding k input symbols to form r redundant symbols using p parallel paths, for the case wherein k is not divisible by p, but r is divisible by p.

DETAILED DESCRIPTION OF THE INVENTION

Figure 1:
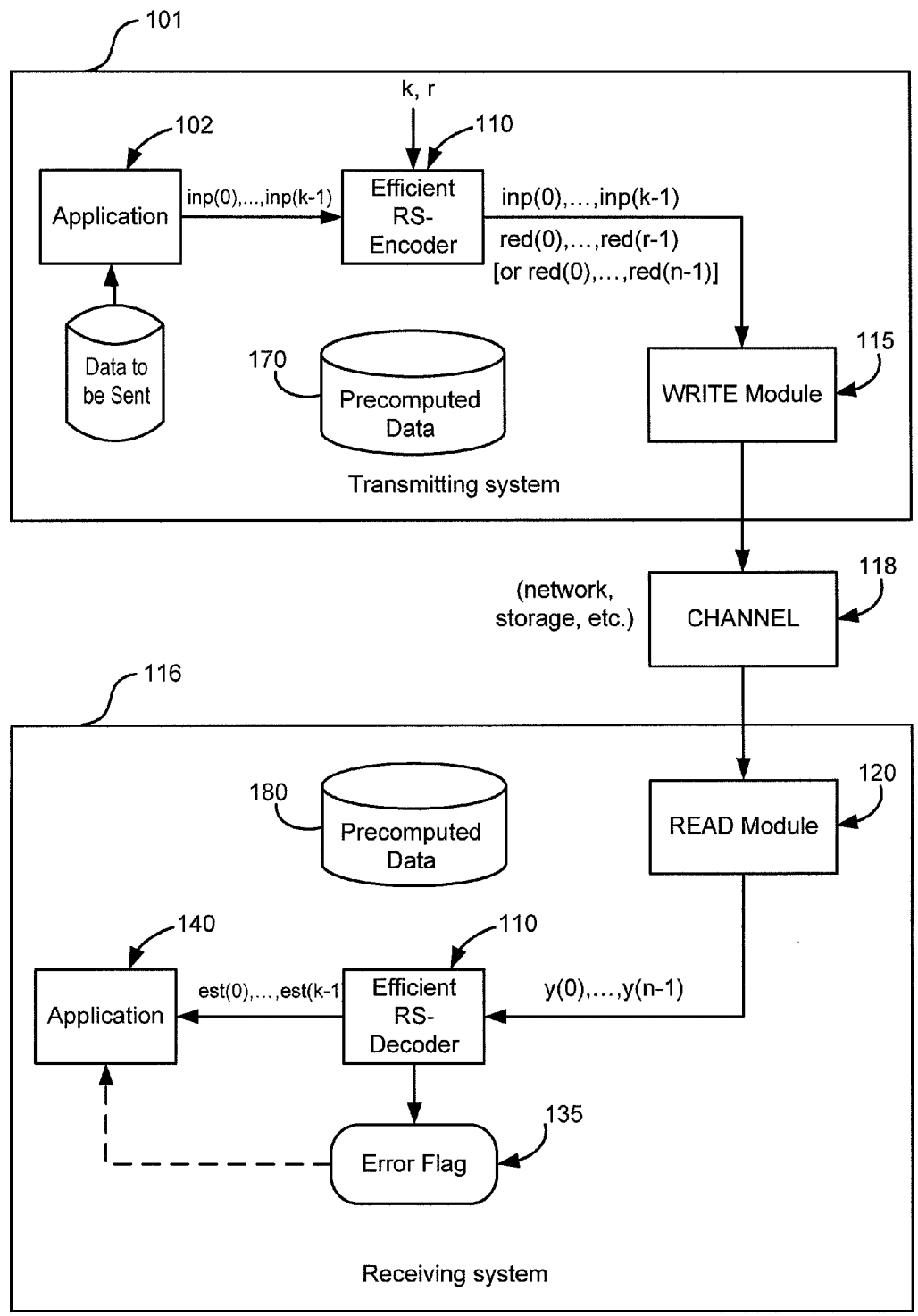
FIG. 1 illustrates an example of a communication system wherein embodiments of the present invention might be used.

FIG. 1 illustrates a communications system wherein the present invention can be used. In general, the communications system is such that there are constraints on the computational hardware, programming and time available for communications tasks and those constraints require efficiency measures in the implementation of encoders and/or decoders. In specific embodiments, this efficiency is obtained by dividing an input data set into parallel paths, transforming the parallel paths of input data into an intermediate set of parallel paths of data, processing the intermediate set and performing an inverse transform on the result, to obtain an output data set divided into parallel sets and usable as encoder outputs.

As illustrated there, a transmitting system 101 comprises a sending application 102, an encoder 110, and a write module 115. A receiving system 116 is shown comprising a receiving application 140, a decoder 130 and a read module 120. In each case, more specific embodiments are contemplated. For example, transmitting system 101 and receiving system 116 might each comprise a personal computer, a server, a cell phone, an embedded device, a media player, a portable computer or computing device, music player, or part of a larger system, etc., so long as the transmitting system has data to be transmitted (or an input to receive it), the ability to encode it and write/send the data to a channel (such as a network, a storage device, a wired or wireless communications channel, etc.) and the receiving system has the ability to read/receive data from the channel and a decoder that attempts to recover the originally sent input data from the received input data and redundant data. The applications might be the only applications on the system, such as where the system is dedicated to receiving and decoding data, but might also be part of a larger system, such as a general purpose computer or a device that performs other functions, such as media presentation/playback.

In an example process, application 102 provides the data to be sent and provides it to encoder 110 in the form of an input vector of k symbols inp(0), . . . , inp(k−1), each comprising log(q) bits (at least approximately) where each symbol is interpreted as an element of GF(q). Application 102 could be a physical application, or a logical one. For example, the application could be a hardware device that reads the input symbols from a piece of memory, or it could be a software device listening to yet another application that generates the input symbols on the fly. An example of the former is a hard disk, in which the application is a disk reading software, used in combination with signal processing hardware and a read-head, that together reads the data on the hard disk in blocks of k symbols and provides it to encoder 110.

An example of the latter is an application that listens for data provided by, for example, a movie capturing device. Whenever k symbols are captured, application 102 provides it to encoder 110. This operation could also be performed substantially concurrently with the generation of the input symbols. That is, the symbols could be forwarded directly by the application (or received at an input) at the time of their inception, rather than waiting for the entire block of k symbols to become available before forwarding to encoder 110.

Encoder 110 in turn generates r redundant symbols red(0), . . . , red(r−1) from the input symbols. Generally, these symbols are over the same alphabet as the input symbols, i.e., over GF(q). Encoder 110 has access to the parameters k and r. This access could be hard-wired into encoder 110 or provided from an external source or programmed location. For example, if the encoder is a hardware device, the parameters could be part of the design of the hardware. In other examples, encoder 110 could be a piece of software, and the parameters could be given by an external user or source or stored in memory.

As presented in the examples here, the encoder is systematic, i.e., the input symbols inp(0), . . . , inp(k−1) are part of the output of encoder 110, and usually all precede or all follow the redundant symbols. This is not necessary in practice, and the current disclosure can be modified by someone skilled in the art after reading this disclosure to also cover the case in which the encoder is not systematic.

Encoder 110 forwards the sequence comprising the input and the redundant symbols to write module 115. The task of this module is to prepare the symbols for sending them over channel 118, whatever that may be. For example, where encoding is used to protect data on a hard disk, the write module might comprise disk writing software, used in combination with signal processing hardware and a write-head, that together writes data on the hard disk in blocks of k symbols. As another example, where data is transmitted over a communications medium, such as a wireless network, the task of the write module 115 could be the transmission of the data comprising the input symbols and redundant symbols.

Channel 118 could be a physical channel between spatially distinct communication partners, such as a wireless link between the sender and the receiver, or it could be a channel that describes communication over time, as is for example the case for information stored on hard disks. In any event, channel 118 is expected to induce errors on the block of symbols sent through it. Read module 120 reads information as it is forwarded from Channel 118 (with or without storage in the channel or the module, depending on implementation). For example, where channel 118 models the errors encountered after storing information on a hard disk, read module 120 could be the disk reading software and hardware. As another example, where channel 118 is modeling corruption on a wireless link, the read module 120 could be a hardware device that combines reception of the data and their demodulation. In any event, read module 120 forwards a sequence y(0), . . . , y(n−1) of read symbols comprising its estimate of the redundant and input symbols. Where there are no errors and the transmitter uses a systematic encoder that follows the input symbols with redundant symbols, the symbol sequence y(i) is equal to inp(0), . . . , inp(k−1), red(0), . . . , red(r−1).

The symbols y(i) are forwarded to decoder 130, which attempts to decode the sequence to obtain an estimate est(0), . . . , est(k−1) of the input symbols. The sequence est(i) is equal to the sequence inp(i) if decoder 130 corrects all the errors, but decoder 130 might also issue an error flag 135 indicating that it could not correct all the errors it detected and might also fail to issue an error flag and output erroneous data, if the error rate was so high that undetected errors occurred.

In case of successful decoding, the sequence of input symbols is forwarded to application 140. The task of application 140 is to further process the input symbols in some way that is not described in detail here. For example, where the input symbols correspond to information stored on a hard disk, the task of application 140 would be to forward the information to the device of the process requesting it.

The Encoder

Figure 2:
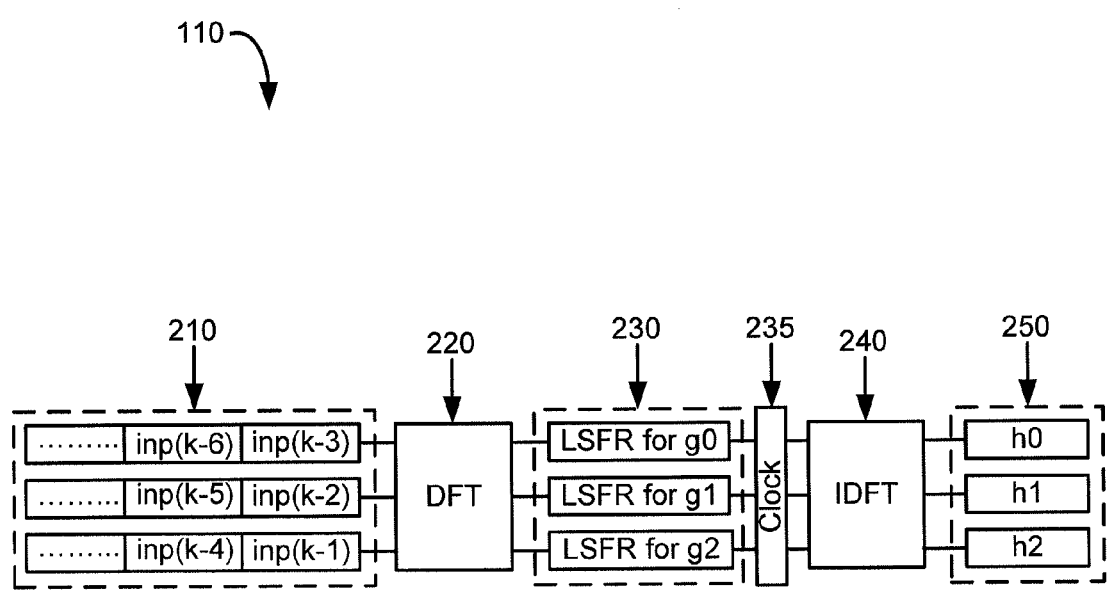
FIG. 2 illustrates an example of an encoder according to embodiments of the present invention, usable for encoding k input symbols to form r redundant symbols using p parallel paths, for the case wherein k and r are divisible by p.

FIG. 2 illustrates some operations of encoder 110 according to aspects of the present invention when k and r are both divisible by p. The operation for the case p=3 is the only one illustrated, though this is not intended to limit the scope of the invention, as the reader can determine modifications that use any divisor of n=k+r after reading this disclosure.

Encoder 110 has access to a set of data computed offline. This is illustrated in FIG. 1 as precomputed data 170. Decoder 130 has similar precomputed data 180. Data 170 includes data corresponding to a divisor p of n, a primitive element a of GF(q), and a list of p generator polynomials $g_0(x), \ldots, g_{p-1}(x)$, wherein the j-th polynomial is calculated according to Equation 1. In Equation 1, l is the largest index such that $j+l*p$ is smaller than r.

$$g_j(x) = (x - \alpha^j) * (x - \alpha^{j+p}) * \ldots * (x - \alpha^{j+l*p}) \quad \text{(Equ. 1)}$$

Figure 3A:
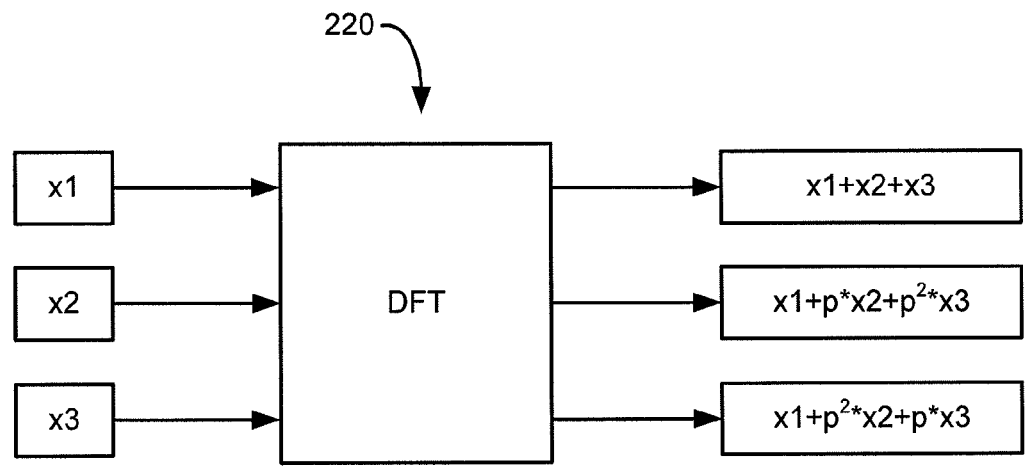
FIG. 3a illustrates the Fourier transform and FIG. 3b illustrates the inverse Fourier transform.

In FIG. 2, storage 210 represents memory or other storage for input symbols inp(i), organized in three paths (since p=3; it would be a different number of paths for a different value of p). Thus, the input data is subdivided into p parts, wherein part j corresponds to the input symbols inp(j), inp(j+p), . . . , inp(k−p+j), for j from 0 to p−1. The p parts are provided sequentially to a DFT unit 220, whose operation is detailed below with reference to FIG. 3a. Each of the p parts is further filled to the left by r/p zeros, so that the length of each part is n/p (i.e., k/p input symbols and r/p zeros). These parts are cycled through DFT unit 220 one-one column at a time (in this example; three symbols at a time), and at each time step, p new symbols are created and output by DFT unit 220. These intermediate symbols are provided to linear feedback shift registers (LFSRs) 230 for the polynomials $g_0, \ldots, g_{p-1}$. These LFSRs 230 can work in their usual way, i.e., run for k/p cycles, and then from cycle k/p+1 on, they forward the value of their top cells to an IDFT unit 240. This can be accomplished by a clock unit 235 that blocks forwarding the top cells of the LFSRs for the first k/p cycles. In this embodiment a DFT (discrete Fourier transform) unit and an IDFT (inverse discrete Fourier transform) unit are used, but other transforms might work instead.

IDFT unit 240 produces p output values for its set of p input values each cycle. These values are shifted forward in every cycle so that, at the end of the last r/p cycles, output registers 250 corresponding to h[0], h[1], ..., h[p-1] contain the redundant symbols red(0), red(p), ..., red(r-p), the symbols red(1), ..., red(r-p+1), and the symbols red(p-1), ..., red(r-1), respectively.

FIG. 3 shows a schematic of an operation of DFT unit 220 and its inverse unit 240. That figure exemplifies the operation for the case p=3. In general, the operation of DFT unit 220 is described with respect to a pre-defined p-th root of unity p in the field GF(q). DFT unit 220 has p inputs, denoted x(0), ..., x(p-1), and p outputs y(0), ..., y(p-1). The j-th output, y(j), is determined from the inputs x(0), ..., x(p-1) as shown by Equation 2

$$y(j)=x(0)+x(1)*\rho^j+\ldots+x(p-1)*\rho^{j*(p-1)} \quad \text{(Equ. 2)}$$

Figure 3B:
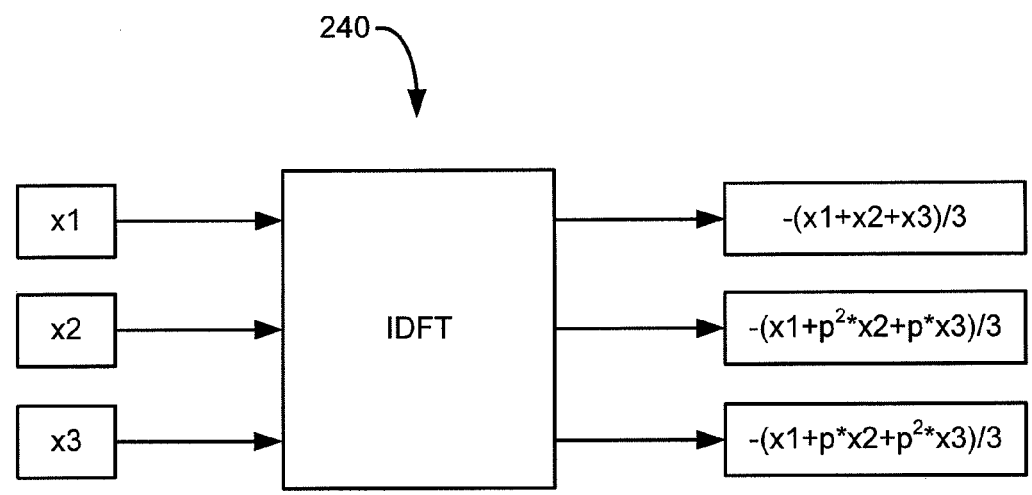

IDFT unit 240, exemplified in FIG. 3b, performs the inverse of DFT unit 220 in the sense that if the output of DFT unit 220 is forwarded as input to IDFT unit 240, then the output of IDFT unit 240 is equal to the input of DFT unit 220.

In operation, if as before x(0), ..., x(p-1) denote the inputs to IDFT unit 240 and y(0), ..., y(p-1) denote the outputs, then the relationship between these quantities is as shown in Equation 3 for values of j between 0 and p-1.

$$y(j)=x(0)+x(1)*\rho^{-j}+\ldots+x(p-1)*\rho^{-j*(p-1)} \quad \text{(Equ. 3)}$$

The description above applies where both k and r are divisible by p. In practice, this may be a restricting condition. However, variations where that is not the case can also be covered.

Figure 4A:
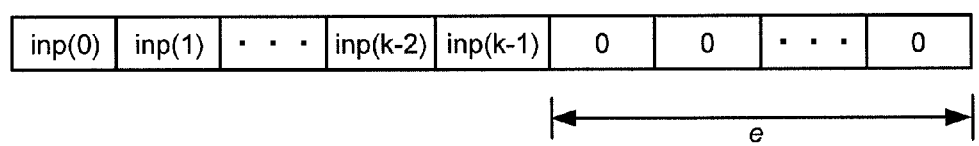
FIG. 4a illustrates padding to a multiple of p and FIG. 4b illustrates the encoder.
Figure 4B:
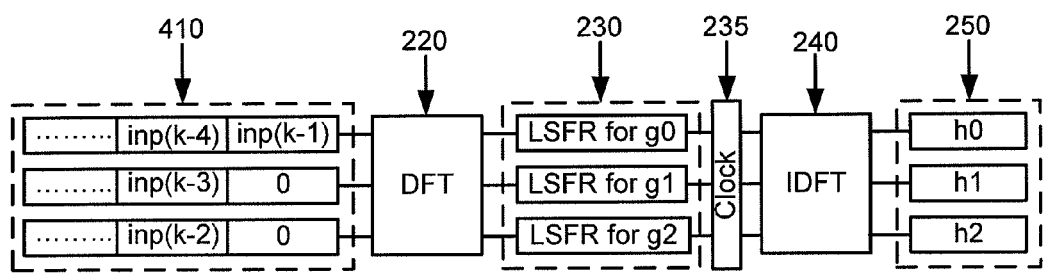

FIG. 4 illustrates such a case, in which r is divisible by p, but k is not. In general, first, the smallest integer e is determined such that k+e is divisible by p. Next, p-e zeros are added to the input sequence, as shown in FIG. 4a. FIG. 4b illustrates the encoding/decoding case in which p=3, and k is congruent to 1 modulo 3. The difference from the prior-described case is that the input sequence 410 has been modified to account for the additional number of zeros.

Figure 5:
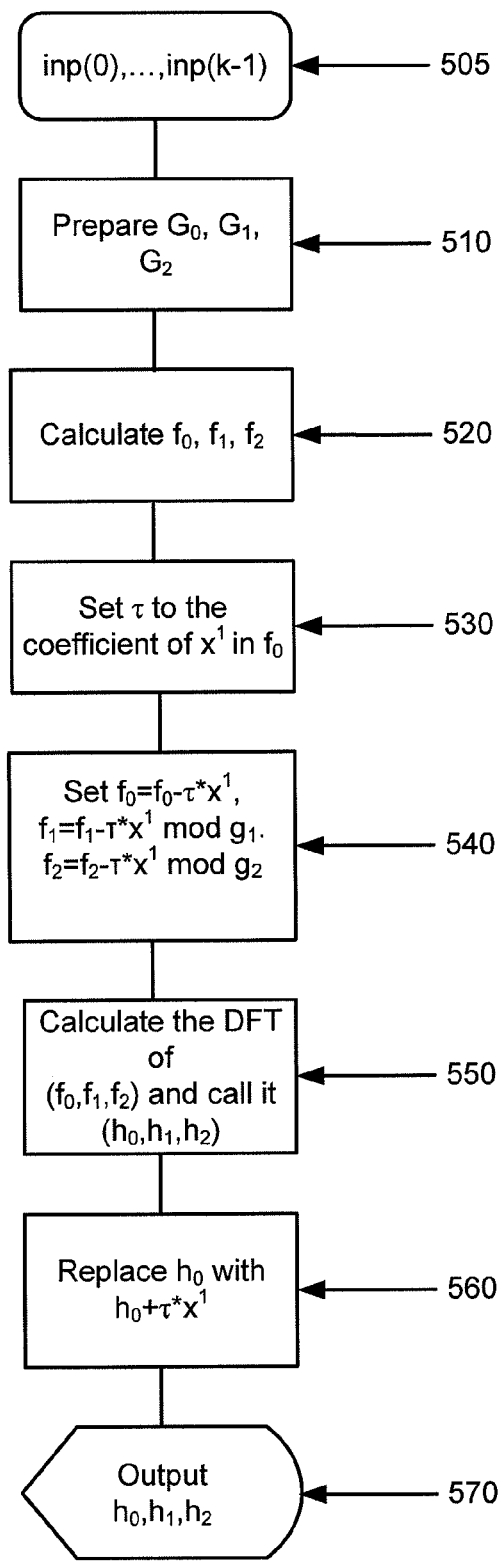
FIG. 5 is a flowchart of a process for parallel encoding according to embodiments of the present invention, with p=3, and r=1 modulo 3, which can be extended for other values of p.
Figure 6:
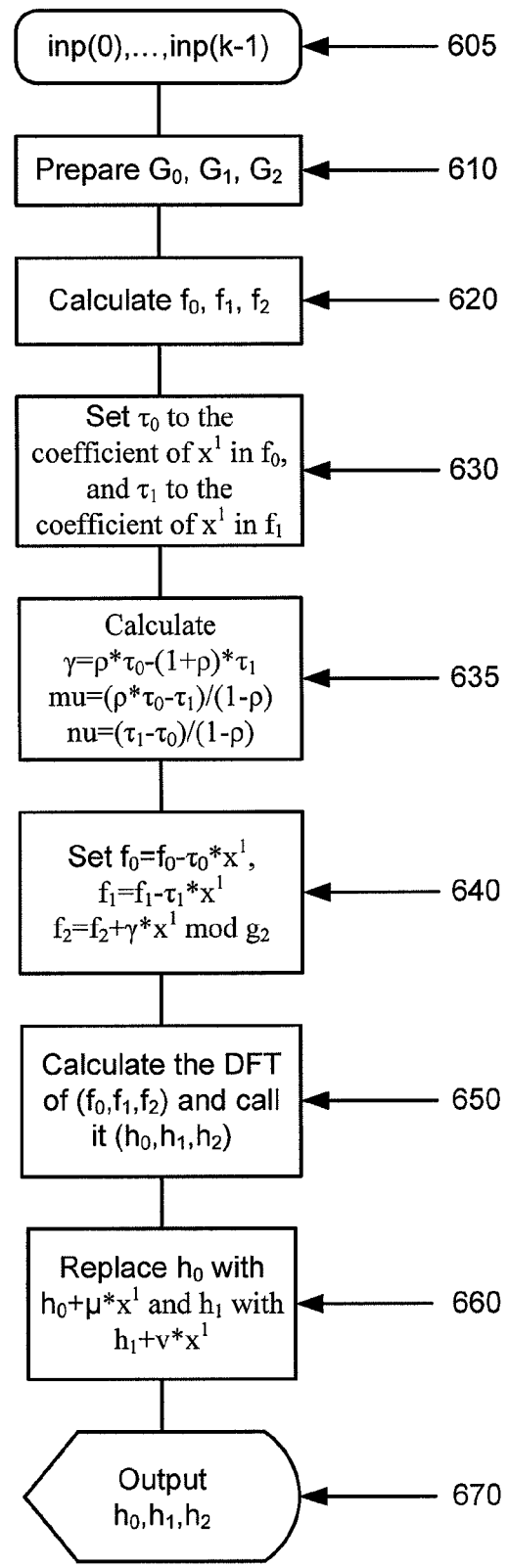
FIG. 6 is a flowchart of a process for parallel encoding according to embodiments of the present invention, with p=3, and r=2 modulo 3, which can be extended for other values of p.

FIGS. 5 and 6 illustrate encoding processes in cases when r is not divisible by p. The example for p=3 is outlined, but the general case can be inferred from this disclosure as can be appreciated by a person of ordinary skill in the art. If r is congruent to 1 modulo 3, then the polynomial $g_0(x)$ has degree l+1, where l is (r-1)/3, and the polynomials $g_1(x)$ and $g_2(x)$ are each of degree l. If r is congruent to 2 modulo 3, then $g_0(x)$ and $g_1(x)$ have degree l+1 and $g_2(x)$ has degree l.

If r is congruent to 1 modulo 3, a case exemplified in FIG. 5, then by padding the input vector with at most two zeros, k can be of the form k=3t+2. Specifically, in step 505, the input vector inp(0), ..., inp(k-1) is provided to an encoder with padded zeroes as needed. In step 510, three polynomials, $G_0(x)$, $G_1(x)$, $G_2(x)$ are calculated according to Equations 4a-c.

$$G_0(x)=\text{inp}(2)+\text{inp}(5)*x+\text{inp}(8)*x^2+\ldots+\text{inp}(k-3)*x^{t-1} \quad \text{(Equ. 4a)}$$

$$G_1(x)=\text{inp}(0)+\text{inp}(3)*x+\text{inp}(6)*x^2+\ldots+\text{inp}(k-5)*x^{t-1}+\text{inp}(k-2)*x^t \quad \text{(Equ. 4b)}$$

$$G_2(x)=\text{inp}(1)+\text{inp}(4)*x+\text{inp}(7)*x^2+\ldots+\text{inp}(k-4)*x^{t-1}+\text{inp}(k-1)*x^t \quad \text{(Equ. 4c)}$$

In those equations, the result is that $G_0(x)$ is of degree less than t, whereas $G_1(x)$ and $G_2(x)$ are of degree at most t. Next, in step 520, three polynomials $f_0$, $f_1$, and $f_2$ are calculated according Equations 5a-c.

$$f_0(x)=(x^{t+1}*G_0(x)+x^t*G_1(x)+x^t*G_2(x)) \text{ modulo } g_0(x) \quad \text{(Equ. 5a)}$$

$$f_1(x)=(x^{t+1}*G_0(x)+x^t*\rho*G_1(x)+x^t*\rho^2*G_2(x)) \text{ modulo } g_1(x) \quad \text{(Equ. 5b)}$$

$$f_2(x)=(x^{t+1}*G_0(x)+x^t*\rho^2*G_1(x)+x^t*\rho*G_2(x)) \text{ modulo } g_2(x) \quad \text{(Equ. 5c)}$$

As should be clear to those of skill in the art from this disclosure, these calculations can be done using DFT unit 220 and linear feedback shift register sequences, in a similar fashion as described above with reference to FIG. 2. In step 530, the top coefficient of $f_0(x)$, called τ, is stored for future use, and in step 530, the polynomials $f_0$, $f_1$, and $f_2$ are replaced by $f_0(x)-\tau*x^l$, $f_1(x)-\tau*x^l$ modulo $g_1(x)$, and $f_2(x)-\tau*x^l$ modulo $g_2(x)$, respectively. Next, three new polynomials, called $h_0$, $h_1$, and $h_2$ are calculated according to Equations 6a-c.

$$h_0(x)=-(f_0(x)+f_1(x)+f_2(x))/3+\tau*x^l \quad \text{(Equ. 6a)}$$

$$h_1(x)=-(f_0(x)+\rho^2*f_1(x)+*f_2(x))/3 \quad \text{(Equ. 6b)}$$

$$h_2(x)=-(f_0(x)+\rho*f_1(x)+\rho^2*f_2(x))/3 \quad \text{(Equ. 6c)}$$

As is clear to those of skill in the art, these operations can be performed using the inverse Fourier transform unit IDFT of FIG. 3b. The redundant symbols red(0), red(1), ..., red(r-1) can now be read off from the coefficients of $h_0$, $h_1$, and $h_2$: denoting by coeff(q, $h_j$) the coefficient of $x^q$ in $h_j(x)$, results in the values shown in Equations 7a-c.

$$\text{red}(0)=\text{coeff}(0,h_0), \text{red}(3)=\text{coeff}(1,h_0), \ldots, \text{red}(r-1)=\text{coeff}(l,h_0) \quad \text{(Equ. 7a)}$$

$$\text{red}(1)=\text{coeff}(0,h_1), \text{red}(4)=\text{coeff}(1,h_1), \ldots, \text{red}(r-2)=\text{coeff}(l-1,h_1) \quad \text{(Equ. 7a)}$$

$$\text{red}(2)=\text{coeff}(0,h_2), \text{red}(5)=\text{coeff}(1,h_2), \ldots, \text{red}(r-3)=\text{coeff}(l-1,h_2) \quad \text{(Equ. 7a)}$$

FIG. 6 illustrates a similar case, but where r is congruent to 2 modulo 3. In that case r=3*l+2, and k=3*t+1. In step 610, three polynomials polynomials $G_0(x)$, $G_1(x)$, $G_2(x)$ are calculated according to the to Equations 8a-c, so that $G_0(x)$ and $G_1(x)$ are of degree less than t, whereas $G_2(x)$ is of degree at most t.

$$G_0(x)=\text{inp}(2)+\text{inp}(5)*x+\text{inp}(8)*x^2+\ldots+\text{inp}(k-3)*x^{t-1} \quad \text{(Equ. 8a)}$$

$$G_1(x)=\text{inp}(1)+\text{inp}(4)*x+\text{inp}(7)*x^2+\ldots+\text{inp}(k-4)*x^{t-1} \quad \text{(Equ. 8b)}$$

$$G_2(x)=\text{inp}(0)+\text{inp}(3)*x+\text{inp}(6)*x^2+\ldots+\text{inp}(k-4)*x^{t-1}+\text{inp}(k-1)*x^t \quad \text{(Equ. 8c)}$$

Next, in step 620, three polynomials $f_0$, $f_1$, and $f_2$ are calculated according to the Equations 9a-c.

$$f_0(x)=(x^{t+1}*G_0(x)+x^{t+1}*G_1(x)+x^t*G_2(x)) \text{ modulo } g_0(x) \quad \text{(Equ. 9a)}$$

$$f_1(x)=(x^{t+1}*G_0(x)+x^{t+1}*\rho*G_1(x)+x^t*\rho^2*G_2(x)) \text{ modulo } g_0(x) \quad \text{(Equ. 9b)}$$

$$f_2(x)=(x^{t+1}*G_0(x)+x^{t+1}*\rho^2*G_1(x)+x^t*\rho*G_2(x)) \text{ modulo } g_0(x) \quad \text{(Equ. 9c)}$$

As is clear to those of ordinary skill in the art, these calculations can be done using DFT unit 220 and linear feedback shift register sequences, in a similar fashion as described with reference to FIG. 2. In step 630, the top coefficients of $f_0(x)$, called to, and the top coefficient of $f_1(x)$, called $\tau_1$, are stored for future use, and in step 635, three auxiliary quantities are calculated according to Equations 10a-c.

$$\gamma = \rho^* \tau_0 - (1+\rho)^* \tau_1 \quad \text{(Equ. 10a)}$$

$$\mu = (\rho^* \tau_0 - \tau_1)/(1-\rho) \quad \text{(Equ. 10b)}$$

$$\nu = (\tau_1 - \tau_0)/(1-\rho) \quad \text{(Equ. 10c)}$$

In step 640, the polynomials $f_0$, $f_1$, and $f_2$ are transformed according to Equations 11a-c.

$$f_0(x) = f_0(x) + \tau_0^* x^l \quad \text{(Equ. 11a)}$$

$$f_1(x) = f_1(x) + \tau_1^* x^l \quad \text{(Equ. 11b)}$$

$$f_2(x) = f_2(x) + \gamma^* x^l \text{ modulo } g_2(x) \quad \text{(Equ. 11c)}$$

There, the polynomials $f_0$, $f_1$, and $f_2$ are replaced by $f_0(x) - \tau_0^* x^l$, $f_1(x) - \tau_1^* x^l$ modulo $g_1(x)$, and $f_2(x) + \gamma^* x^l$ modulo $g_2(x)$, respectively. Next, three new polynomials, called $h_0$, $h_1$, and $h_2$ are calculated according to Equations 12a-c.

$$h_0(x) = -(f_0(x) + f_1(x) + f_2(x))/3 + ^* x^l \quad \text{(Equ. 12a)}$$

$$h_1(x) = -(f_0(x) + \rho^{2*} f_1(x) + \rho^* f_2(x))/3 + \nu^* x^l \quad \text{(Equ. 12b)}$$

$$h_2(x) = -(f_0(x) + \rho^* f_1(x) + \rho^{2*} f_2(x))/3 \quad \text{(Equ. 12c)}$$

As is clear to those of skill in the art, these operations can be performed using the inverse Fourier transform unit IDFT of FIG. 4b. The redundant symbols red(0), red(1), . . . , red(r−1) can now be read off from the coefficients of $h_0$, $h_1$, and $h_2$: denoting as before by coeff(q, $h_j$) the coefficient of x in $h_j(x)$, which results in the values shown in Equations 13a-c.

$$\text{red}(0) = \text{coeff}(0, h_0), \text{red}(3) = \text{coeff}(1, h_0), \ldots, \text{red}(r-2) = \text{coeff}(l, h_0) \quad \text{(Equ. 13a)}$$

$$\text{red}(1) = \text{coeff}(0, h_1), \text{red}(4) = \text{coeff}(1, h_1), \ldots, \text{red}(r-1) = \text{coeff}(l, h_1) \quad \text{(Equ. 13b)}$$

$$\text{red}(2) = \text{coeff}(0, h_2), \text{red}(5) = \text{coeff}(1, h_2), \ldots, \text{red}(r-3) = \text{coeff}(l-1, h_2) \quad \text{(Equ. 13c)}$$

The Decoder

Figure 7:
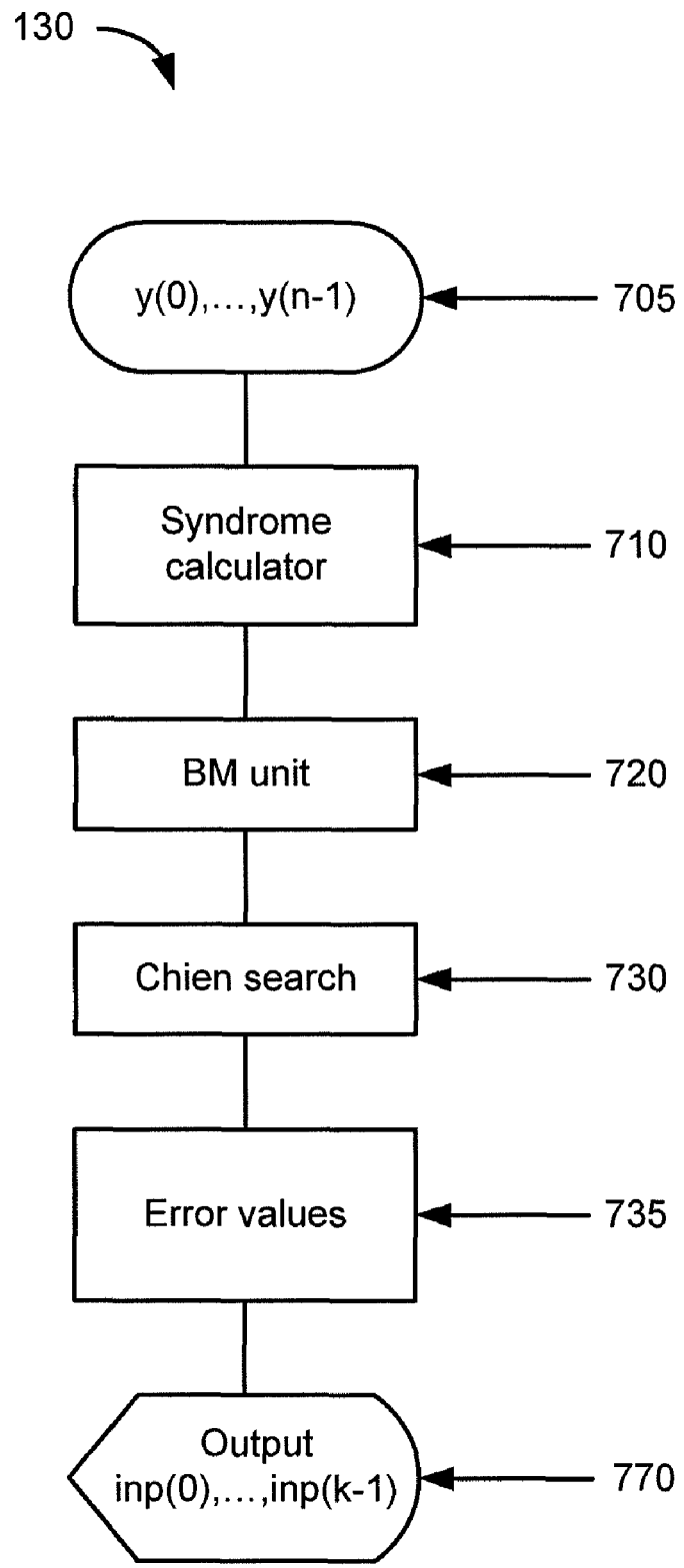
FIG. 7 is a flowchart generally describing a process for decoding data encoded using Reed-Solomon codes.

In reference to FIG. 7, a procedure is now described for decoding according to embodiments of the present invention. The overall structure of the decoding, as shown in FIG. 7, is similar to that of prior art for decoding Reed-Solomon codes. Given a sequence y(0), . . . , y(n−1) of symbols in (705), the decoder first passes these symbols to a syndrome calculator (710). This unit produces r symbols s(0), . . . , s(r−1). These syndromes are passed to a Berlekamp-Massey (BM) unit (720). This unit produces two polynomials, v(x) and u(x), where the degree of v(x) is smaller than that of u(x) and the degree of u(x) is equal to the number of positions in which the vector (y(0), y(1), . . . , y(n−1)) differs from a valid codeword. The polynomial u is forwarded to a Chien search unit (730), and this unit will find all the positions of the received vector that are different from the codeword closest to this vector. An error values unit (735) finally calculates the magnitudes of errors in these positions, and upon subtracting these errors, the input vector is recovered in step 770. As is known to those of skill in the art, the Chien search and the computation of the error values can be done substantially concurrently by one unit.

As was mentioned before, the overall flow of the decoding operation is similar to prior art. The differences occur in the syndrome calculator, and the Chien search unit.

In the exemplary case where p=3, we denote $$L_0(x) = y(0) + y(3)^* x + y(6)^* x^2 + \ldots + y(n-3)^* x^{m-1}$$

$$L_1(x) = y(1) + y(4)^* x + y(7)^* x^2 + \ldots + y(n-2)^* x^{m-1}$$

$$L_2(x) = y(2) + y(5)^* x + y(8)^* x^2 + \ldots + y(n-1)^* x^{m-1}$$

and compute $$F_0(x) = L_0(x) + L_1(x) + L_2(x)$$

$$F_1(x) = L_0(x) + \rho^* L_1(x) + \rho^{2*} L_2(x)$$

$$F_2(x) = L_0(x) + \rho^{2*} L_1(x) + \rho^* L_2(x)$$

The syndromes $s_0, s_1, \ldots, s_{n-k-1}$ are now obtained as $$S_l = \begin{cases} F_0(\alpha^l) & l \equiv 0 \mod 3 \\ F_1(\alpha^l) & l \equiv 1 \mod 3 \\ F_2(\alpha^l) & l \equiv 2 \mod 3 \end{cases}$$

Figure 8:
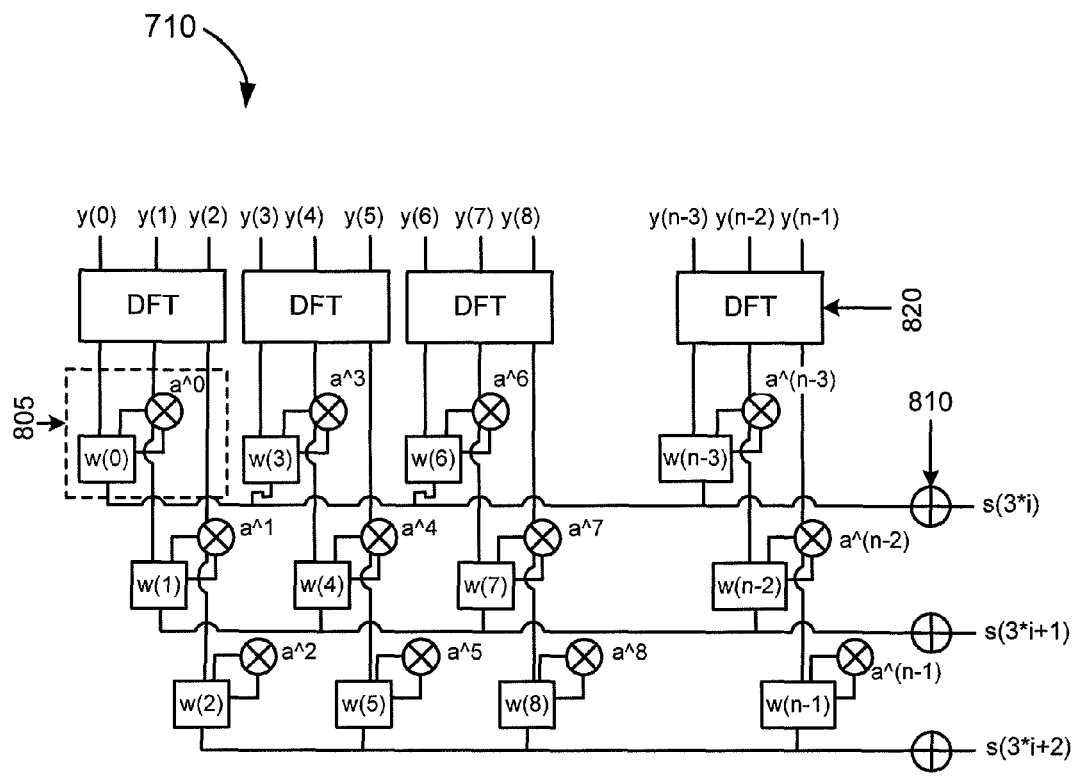
FIG. 8 illustrates a circuit for computing syndromes.

The operation of the syndrome calculator unit is now detailed in FIG. 8 according to the above description, exemplified for the case p=3. As was mentioned before, the depiction of this particular case is not meant to be restrictive, and is only for illustrative purposes. In particular, any divisor of n can be chosen instead of 3.

The syndrome calculator unit of FIG. 8 comprises various parts. There are in total n/3 DFT units, of which one, 820, is depicted. Moreover, the unit comprises n multiplier units 805 whose operation is further detailed in FIG. 9. There are furthermore three XOR units 810. This module, which in this illustration is assumed to work in cycles, each cycle producing three new syndrome values, expects as input the vector y. On each set of 3 consecutive entries, a Fourier transform unit is applied. The combined output of these n/3 units is denoted by w(0), . . . , w(n−1). In each computation cycle, the results of the multipliers are updated and XOR'd as shown. The multipliers with an index congruent to 0 modulo 3 are XOR'd together, those with an index congruent to 1 modulo 3 are XOR'd together, and those with an index congruent to 2 modulo 3 are XOR'd together. The results of these XOR's are the syndromes s(3*i), s(3*i+1), and s(3*i+2), at step i. It should be noted that the XOR of several registers can be done using delay elements.

Figure 9:
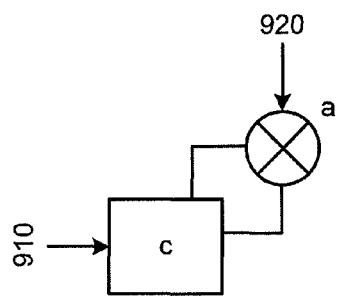
FIG. 9 is a block diagram of a multiplier as might be used in the circuit of FIG. 8.

The operation of the multiplier 805 is further detailed in FIG. 9. The multiplier has a register 910 that is updated in every cycle, and a constant multiplier 920. In FIG. 9, the content of register 910 is denoted by c, and the value of the multiplier 920 by a. In every cycle, the content of the register is updated according to the rule that c is replaced by c*a.

Figure 10:
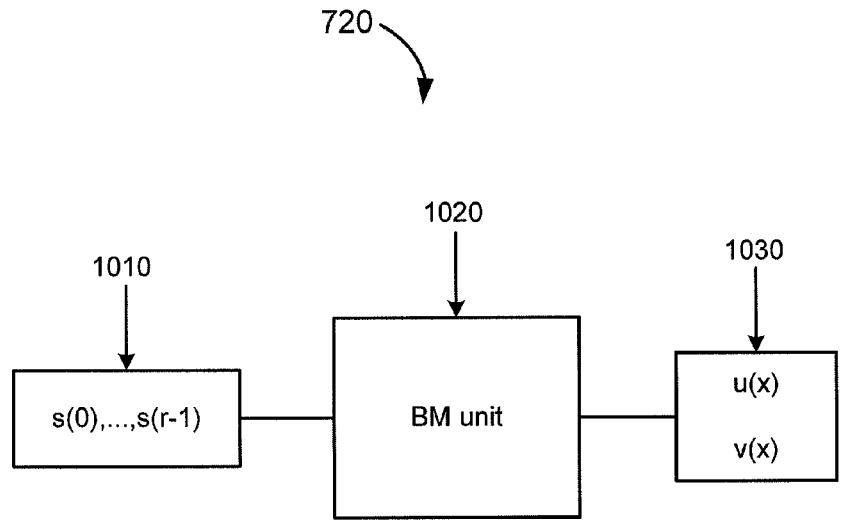
FIG. 10 is a block diagram of a Berlekamp-Massey unit.

FIG. 10 is a schematic of the operation of the BM unit 720. The input to this unit is the vector of syndromes 1010. The outputs are the polynomials u and v discussed above. In particular, we have $$\sum_{i=0}^{n-k-1} s_i x^i \equiv \frac{v(x)}{u(x)} \mod x^{n-k}.$$

The Chien search also benefits from the Fourier Transform Unit. More specifically, given the polynomial $u(x) = u(0) + u(1)^* x + \ldots + u(e)^* x^e$, assume that e+1 is divisible by p. This is easily achieved by artificially increasing the number of coefficients of u(x) by adding zero coefficients. Then, perform for all values of i from 0 to m−1, the following:

$$a_0 = \sum_{\substack{0 \le j \le e \\ j = 0 \bmod 3}} u_j \alpha^{-ij},$$

$$a_1 = \sum_{\substack{0 \le j \le e \\ j = 1 \bmod 3}} u_j \alpha^{-ij},$$

$$a_2 = \sum_{\substack{0 \le j \le e \\ j = 2 \bmod 3}} u_j \alpha^{ij}.$$

$w_0 = a_0 + a_1 + a_2$, $w_1 = a_0 + \rho a_1 + \rho^2 a_2$, $w_2 = a_0 + \rho^2 a_1 + \rho a_2$.

If for some j, the value of $w_j$ is zero, then include 3*i+j as an error position.

Figure 11:
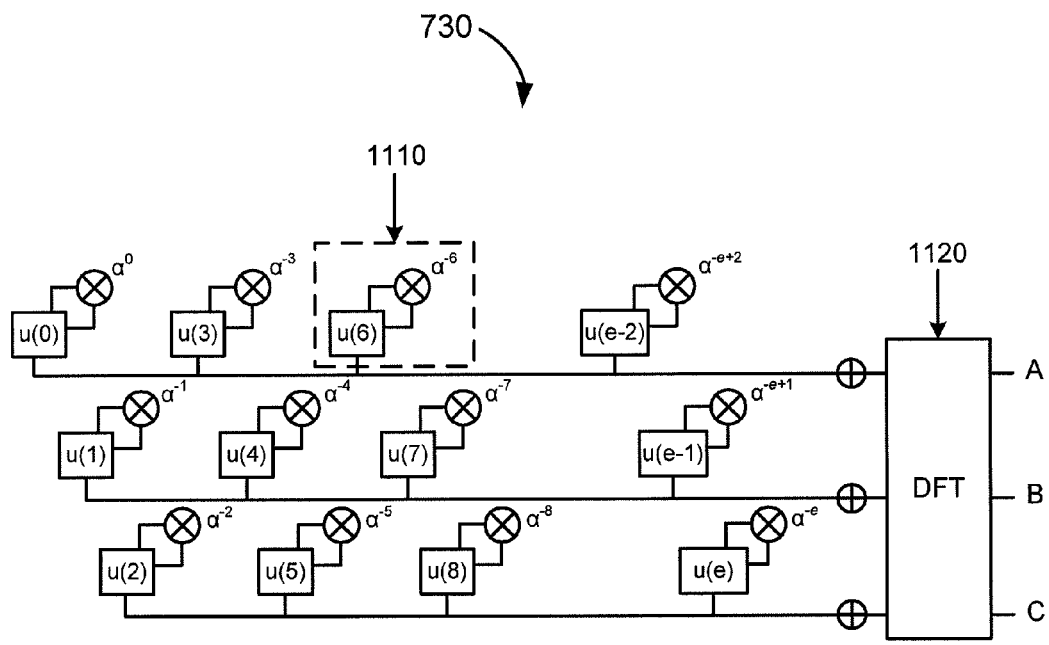
FIG. 11 is a block diagram of a circuit usable for a Chien search.

The operation of the Chien search unit 730 is now detailed in FIG. 11 with reference to this procedure. The Chien search unit contains e+1 multiplier units 1110, and one DFT unit 1120. Moreover, there are 3 XOR units which each calculates the XOR of (e+1)/3 multiplier contents each. As with the syndrome calculator, the contents are collected according to their index modulo 3. The results of the XOR's are fed to DFT unit 1120, which calculates the values $u(\alpha^{-i}*\rho)$ for j=0, 1, 2. If a value corresponding to j turns out to be zero, the position 3i+j is flagged as an error position. In this case, the error values unit 735 calculates the error values according to $\epsilon = \mu (\alpha^{-i}*\rho^j)/h(\alpha^{-i}*\rho)$, wherein h(x) is the polynomial obtained from u(x) by discarding the coefficients of even powers of x. The computation of these error values can be done substantially concurrently with the Chien search, as is evident to those of ordinary skill in the art.

Benefits

Through the use of the Fourier transform technique, the computation is broken down into smaller and independent pieces which can be accomplished concurrently. The hardware cost of this solution is comparable to that of prior art, whereas the computation is accelerated by a factor close to p. Alternatively, as is clear to people of ordinary skill in the art, the computation time can be traded off with the hardware, so that it is easy to obtain an encoder and a decoder from this disclosure which operates at the same speed as prior art, but requires less hardware. Other transforms can be used instead.

Example

Below is a more detailed example of encoding and decoding processes. In this example, the base field is GF(31), p=3, α is the primitive root 3, and ρ is the element $3^{10}=25$, and set r=1 and k=13. The first task is the calculation of the polynomials $g_0(x)$, $g_1(x)$, and $g_2(x)$:

$g_0=(x-1)(x-\alpha^3)(x-\alpha^6)(x-\alpha^9)=x^4+20x^3+15x^2+22x+4$ $g_1=(x-\alpha)(x-\alpha^4)(x-\alpha^7)(x-\alpha^{10})=x^4+29x^3+11x^2+5x+14$ $g_2=(x-\alpha^2)(x-\alpha5)(x-\alpha^8)=x^3+7x^2+4x+1$ Consider the following input vector to be encoded:

v=(30,20,20,9,25,1,7,2,0,18,17,22,11).

In this case, l=3, and we have the following polynomials:

$x^{l+1}G_0=17x^7+2x^6+25x^5+20x^4$ $x^{l+1}G_1=22x^7+x^5+20x^4$ $x^l G_2=11x^7+18x^6+7x^5+9x^4+30x^3$

The DFT matrix and its inverse IDFT in this case are $$\text{DFT} = \begin{pmatrix} 1 & 1 & 1 \\ 1 & 25 & 5 \\ 1 & 5 & 25 \end{pmatrix}, \text{IDFT} = \begin{pmatrix} 21 & 21 & 21 \\ 21 & 12 & 29 \\ 21 & 29 & 12 \end{pmatrix}$$

Next, we apply the procedure in FIG. 6. The calculation of $f_0$, $f_1$, and $f_2$ in step 620 amounts to $f_0=(19x^7+20x^6+2x^5+18x^4+30x^3) \bmod g_0=27x^3+30x^2+27x+5$ $f_1=(2x^7+30x^6+23x^5+7x^4+26x^3) \bmod g_1=17x^3+10x^2+12x+29$ $f_2=(30x^7+18x^6+19x^5+4x^4+6x^3) \bmod g_2=16x^2+30x+25$ Following step 630 of FIG. 6 results in $\tau_0=27$ and $\tau_1=17$. Further, according to step 635, we have $$\gamma = \rho \tau_0 - (1+\rho)\tau_1 = 16, \mu = \frac{\rho \tau_0 - \tau_1}{1-\rho} = 1, \nu = \frac{\tau_1 - \tau_0}{1-\rho} = 3$$

Continuing with step 640, we obtain $f_0=30x^2+27x+5$ $f_1=10x^2+12x+29$ $f_2=f_2+(16x^3 \bmod g_2)=f_2+12x^2+29x+15=28x^2+28x+9$.

Following step 650, we have $h_0=x^3+29x^2+19x+27$, $h_1=3x^3+19x^2+27x+30$, $h_2=15x^2+20x$.

Accordingly, the encoding of the vector v is the vector c=(27,30,0,19,27,20,29,19,15,1,3|30,20,20,9,25,1,7,2,0,18,17,22,11).

The vertical line is the division point between the redundant and the source coordinate positions. We now exemplify the operation of the decoder with the example of the received vector Y=(27,30,10,19,27,20,29,19,15,<u>4</u>,3|30,20,<u>0</u>,<u>0</u>,<u>12</u>,25,1,<u>10</u>,<u>2</u>,<u>0</u>,18,17,22,11).

which differs from c in 5 positions marked by underlining. We now apply the procedure introduced above to obtain $L_0=17x^7+2x^6+25x^5+20x^4+4x^3+29x^2+19x+27$, $L_1=22x^7+x^5+3x^3+19x^2+27x+30$, $L_2=11x^7+18x^6+10x^5+12x^4+30x^3+15x^2+20x+10$, Their Fourier Transform is given by $F_0=19x^7+20x^6+5x^5+x^4+6x+x^2+4x+5$, $F_1=2x^7+30x^6+7x^5+18x^4+12x^3+21x^2+19x+21$, $F_2=30x^7+18x^6+x^5+10x^4+25x^3+3x^2+3x+24$.

| I | 0 | 1 | 2 | 3 | 4 | 5 | 6 | 7 | 8 | 9 | 10 |
|---|---|---|---|---|---|---|---|---|---|---|----|
| $s_I$ | 30 | 17 | 30 | 20 | 23 | 14 | 22 | 4 | 15 | 21 | 10 |

The Berlekamp-Massey algorithm shows that $$\sum_{i=0}^{n-k-1} s_i x^i \equiv \frac{v(x)}{u(x)} \bmod x^{n-k} \bmod x^{11}.$$

The values $a_0, a_1, a_2$, and $w_0, w_1$, and $w_2$ at each step i of the procedure are given below:

| i | 0 | 1 | 2 | 3 | 4 | 5 | 6 | 7 |
|---|---|---|---|---|---|---|---|---|
| $a_0$ | 25 | 26 | 18 | 20 | 4 | 8 | 7 | 15 |
| $a_1$ | 28 | 13 | 29 | 30 | 4 | 7 | 1 | 28 |
| $a_2$ | 10 | 26 | 11 | 12 | 4 | 13 | 1 | 25 |
| $w_0$ | 1 | 3 | 27 | 0 | 12 | 28 | 9 | 6 |
| $w_1$ | 12 | 28 | 4 | 5 | 0 | 27 | 6 | 5 |
| $w_2$ | 0 | 16 | 23 | 24 | 0 | 0 | 6 | 3 |

The error locations are therefore $3*0+2=2$, $3*3+0 = 9$, $3*4+1=13$, $3*4+2=14$, and $3*5+2=17$, which is correct. To calculate the error values, we use the identities:

$$v(x)=7x^4+26x^3+20x^2+5x+30,$$

$$u'(x)=3x^4+2x^3+10x^2+25x+12.$$

The error values are now obtained as $$\varepsilon_2 = -\rho^2 \frac{v(\rho^{-2})}{u'(\rho^{-2})} = 10,$$

$$\varepsilon_9 = -\alpha^2 \frac{v(\alpha^{-3})}{u'(\alpha^{-3})} = 3,$$

$$\varepsilon_{13} = -\alpha^4 \frac{v(\alpha^{-4}\rho^{-1})}{u'(\alpha^{-4}\rho^{-1})} = 11,$$

$$\varepsilon_{14} = -\alpha^4 \rho^2 \frac{v(\alpha^{-4}\rho^{-2})}{u'(\alpha^{-4}\rho^{-2})} = 3,$$

$$\varepsilon_{17} = -\alpha^5 \rho^2 \frac{v(\alpha^{-5}\rho^{-2})}{u'(\alpha^{-5}\rho^{-2})} = 3.$$

Further embodiments can be envisioned to one of ordinary skill in the art after reading this disclosure. In other embodiments, combinations or sub-combinations of the above disclosed invention can be advantageously made. The example arrangements of components are shown for purposes of illustration and it should be understood that combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

What is claimed is:

1. A method of encoding an input vector of k symbols to obtain r redundant symbols, the k symbols being defined over a finite field of q elements using a generalized Reed-Solomon code, the method comprising:
   selecting a divisor p of q−1, wherein p is greater than 1;
   selecting a primitive element a of the field GF(q);
   computing p generator polynomials, wherein the degree of each generator polynomial is equal to an integer that is the nearest integer greater than r/p or the nearest integer less than r/p;
   representing, by an encoder implemented at least in part with at least one processor, the input vector as a value having a length that is evenly divisible by p to form an extended input vector having a length equal to or greater than the length of the input vector;
   subdividing, by the encoder, logically or physically, the extended input vector into p equal vector parts;
   performing, by the encoder, a transformation of the p vector parts to obtain p intermediate parts, each intermediate part having a length m, wherein each symbol of each of the intermediate parts is depends from the symbols of the p vector parts;
   performing, by the encoder, concurrently or substantially concurrently with the transformation, an encoding operation on each intermediate part to obtain p blocks of intermediate redundant symbols;
   post-processing by the encoder, the p blocks of intermediate redundant symbols;
   performing, by the encoder, another transformation of the p post-processed blocks of intermediate redundant symbols to obtain p blocks of second intermediate redundant symbols; and
   performing, by the encoder, another post-processing operation on the p second intermediate redundant symbols to obtain p blocks of redundant symbols, wherein the p blocks of redundant symbols represent the r redundant symbols.

2. The method of claim 1, wherein the divisor p is 3.

3. The method of claim 1, wherein the steps of selecting a divisor p, selecting a primitive element α, and computing the p generator polynomials are performed prior to receiving the input vector.

4. The method of claim 1, wherein an i-th polynomial in a list of the p generator polynomials is the product of (x−αs), wherein s is nonnegative, congruent to i modulo p and less than r.

5. The method of claim 1, wherein representing the input vector as an extended input vector comprises padding the input vector with the smallest number of zeros such that the length of the input vector plus the number of zeros is divisible by p.

6. The method of claim 1, wherein performing a transformation of the p vector parts to obtain the p intermediate parts comprises using m Fourier Transforms of length p on the m vectors of symbols of equal index within each of the p blocks.

7. The method of claim 1, wherein performing concurrently or substantially concurrently an encoding operation on each intermediate part is done using p linear feedback shift registers on each of the p vector parts and wherein the feedback polynomial of the i-th linear feedback shift register corresponds to a i-th polynomial of the p generator polynomials.

8. The method of claim 1, wherein post-processing p blocks of intermediate symbols comprises:
- selecting, for blocks corresponding to generator polynomials of degree ceil(r/p), the symbols with the largest index, storing them for later use, and removing them from the blocks;
- adding a function of the largest coefficients to the coefficients of largest index in the blocks corresponding to generator polynomials of degree floor(r/p); and
- performing one step of a linear feedback shift register for all the blocks corresponding to generator polynomials of degree floor(r/p).

9. The method of claim 1, wherein performing another transformation of the p post-processed blocks of intermediate redundant symbols comprises performing an inverse Fourier Transform of length p on each vector obtained from symbols of equal index within each block of p post-processed intermediate redundant symbols.

10. The method of claim 1, wherein another post-processing on the p second intermediate redundant symbols comprises adding the values of symbols of largest index within the blocks of intermediate redundant symbols corresponding to generator polynomials of degree ceil(r/p).

11. A method of decoding a received input vector comprising n symbols y(0), ..., y(n−1) over a finite field of q elements using a generalized Reed-Solomon code to obtain k original input symbols, the method comprising:
- selecting a divisor p of q−1, wherein p is greater than 1;
- selecting a primitive element a of the field GF(q);
- calculating, by a decoder implemented at least in part with at least one processor, a set of r syndromes s(0), s(r−1) from the received input vector;
- determining, from the set of said syndromes and by the decoder, two polynomials v(x) and u(x), wherein the degree of v(x) is smaller than that of u(x), and the degree of u(x) is at most equal to an anticipated number of errors in the received input vector;
- determining, by the decoder, a set of indices j from roots of the polynomial u(x) corresponding to the error positions; and
- determining, by the decoder, for each such j, a quantity epsilon(j) corresponding to a value of error at position j.

12. The method of claim 11, wherein the divisor p is 3.

13. The method of claim 11, wherein calculating the set of r syndromes further comprises:
- performing, for each s between 0 and (n−1)/p, a Fourier Transform of length p on the set of symbols y(s*p), ... y((s+1)*p−1) to obtain a new set of p symbols z(s,0), ..., z(s,p−1); and
- performing, for each j between 0 and p−1, a computation of the quantity $$z(0,j)+z(1,j)*\alpha^{p*l+j}+z(1,j)*\alpha^{2*(p*l+j)}+\ldots$$

and setting s(p*l+j) equal to this quantity, wherein l is an index between 0 and r/p−1.

14. The method of claim 13, wherein the computation of z(s,j) is done concurrently for all s and j.

15. The method of claim 13, wherein the computation of s(p*l+j) is done concurrently for all j, and sequentially for all l.

16. The method of claim 11, wherein the process of determining the polynomials v(x) and u(x) comprises using the Berlekamp-Massey algorithm for determining the shortest linear feedback shift register for the sequence of syndromes.

17. The method of claim 11, wherein the process of determining the polynomials v(x) and u(x) comprises using the Extended Euclidean Algorithm.

18. The method of claim 11, wherein the step of determining a set of indices j from the roots of the polynomial u(x) comprises determining all the indices j between 0 and n/p−1 such that $u(\alpha^{-j})=0$.

19. The method of claim 18, further comprising:
- subdividing the polynomial u(x) into its coefficients u[0], ..., u[t];
- if t+1 is not divisible by p, padding the coefficients of u(x) with the fewest number of zeros and incrementing t until t+1 is divisible by p;
- determining for each j=0, ..., p−1 and each I=0, ..., n/p−1 the quantities $$w(j,i)=u[j]*\alpha^{-i*j}+u[j+p]*\alpha^{-i*(j+p)}+u[j+2*p]*\alpha^{-i*(j+2*p)}+\ldots;$$

- performing a Fourier Transform on length p on w(0,i), ..., w(p−1,i) to obtain z(0,i), ..., z(p−1,i); and
- if for some j the value of z(j,i) is zero, including p*i+j as an error position.

20. The method of claim 19, wherein the computation of w(j,i) is accomplished concurrently for all j, and sequentially for all i.

21. The method of claim 11, wherein for each j determining the quantity epsilon(j) comprises using Forney's formulas.

22. The method of claim 11, wherein the steps of determining the error positions and the error values are performed concurrently or substantially concurrently.

* * * * *